United States Patent [19]

Ogasawara

[11] Patent Number: 4,968,398

[45] Date of Patent: Nov. 6, 1990

[54] PROCESS FOR THE ELECTROLYTIC REMOVAL OF POLYIMIDE RESINS

[75] Inventor: Shuichi Ogasawara, Ichikawa, Japan

[73] Assignee: Sumitomo Metal Mining Company Limited, Tokyo, Japan

[21] Appl. No.: 507,584

[22] Filed: Apr. 11, 1990

[30] Foreign Application Priority Data

Apr. 21, 1989 [JP] Japan .................................. 1-103200

[51] Int. Cl.$^5$ .............................................. C25F 5/00
[52] U.S. Cl. .................................................. 204/146
[58] Field of Search ........................................ 204/146

[56] References Cited

FOREIGN PATENT DOCUMENTS 51-41032  4/1976  Japan .

Primary Examiner—T. M. Tufariello
Attorney, Agent, or Firm—Watson, Cole, Grindle & Watson

[57] ABSTRACT

When a copper-polyimide substrate which has been prepared by forming an electrolessly plated copper layer on a polyimide resin, and heat treated at a temperature of 120° C. and 420° C., is used to make a tape for tape automated bonding (TAB), any unwanted portion of the resin is dissolved in a solution containing hydrazine hydrate, whereby the copper layer is partially exposed. Then, electrolysis is conducted by using the exposed copper layer as a cathode and an insoluble anode to cause gas to rise from the cathode to thereby remove any undesirably remaining polyimide resin from the substrate.

5 Claims, No Drawings

PROCESSOR FOR THE ELECTROLYTIC REMOVAL OF POLYIMIDE RESINS

BACKGROUND OF THE INVENTION

1. Field of the Invention:

This invention relates to a process for the electrolytic removal of a polyimide resin.

2. Description of the Prior Art

Polyimide resins are often used as insulating materials in electric or electronic apparatus, since they have excellent heat resistance and are also comparable, or even superior, to other plastics in mechanical, electrical and chemical properties. Printed wiring boards (PWB), flexible printed circuits (FPC), tapes for tape automated bonding (TAB), etc. are each manufactured by photoetching a copper film formed on a polyimide-resin base.

A copper-polyimide substrate used for making a PWB, FPC, or tape for TAB has usually been prepared by a laminating process, i.e. bonding a copper foil to a polyimide resin with an adhesive. The substrate prepared by the laminating process has, however, been found defective, since impurities, such as chlorine or sulfate ions, are adsorbed to the adhesive layer between the copper film and the polyimide resin during the etching of the copper film or the removal of a photoresist, and are likely to cause a serious problem, such as an insulation failure, particularly when conducting interconnections forming a circuit on the substrate are very close to one another.

Proposals have, therefore, been made to prepare an improved substrate using electroless plating to form a metal layer on the surface of a polyimide resin directly without the aid of any adhesive, or the like. A brief description will be made of a process proposed for preparing a copper-polyimide substrate by forming an electrolessly plated copper layer on the surface of a polyimide resin. The surface of the polyimide resin is rendered hydrophilic by etching in a solution containing an alkali and a reducing agent, and is caused to adsorb, for example, palladium or silver as a catalyst. Then, the resin surface is electrolessly plated with a solution containing copper ions, such as copper sulfate, whereby a copper film is formed on the resin surface. An electroplating layer of copper may be formed thereon, if required.

The metal layer in the substrate prepared by electroless plating as hereinabove described has a peeling strength of 1500 to 2000 gf/cm at 25° C. which is by far higher than the range of 800 to 1000 gf/cm as has usually been desired in a printed wiring board, or a TAB tape. Its peeling strength at 25° C. is, however, reduced to as low as 100 gf/cm if the substrate is left for only 10 seconds in a soldering bath held at 290° C.

If the substrate is used to make, for example, a TAB tape, the resulting tape is of very low reliability, since the metal layer cannot withstand a temperature of as high as 300° C. to which it is rapidly heated when the leads of the tape are bonded to IC chips, but lowers its peeling strength rapidly and peels off easily.

We, the inventors of this invention, have studied the possible cause for the low thermal shock resistance of the substrate prepared by electroless plating. We have found that a modified layer of low heat resistance is formed on the surface of the polyimide resin by the etching which is carried out before electroless plating, and that the layer is composed of a substance of the amide series which is soluble in a solution of cyanogen or a cyanogen compound used for plating the metal layer patterned to form a circuit on the substrate, and as a result of its dissolution, causes the metal layer to peel off the resin surface.

We have, therefore, proposed a method of preparing an improved copper-polyimide substrate, as is disclosed in United States Patent Application Serial No. 448,635 filed on December 11, 1989. This method is characterized by the heat treatment of an electrolessly plated substrate at a temperature of 120° C. to 420° C. before it is subjected to any thermal shock, as by soldering, or coated with a solution of cyanogen or a cyanogen compound. This heat treatment is intended for converting the modified layer to a thermally or chemically stable substance having an imide bond by the dehydrocondensation of the amide and carboxyl groups which the modified layer contains.

The proposed method has been found to be capable of producing an improved substrate. When it has been dipped in a soldering bath having a temperature of 315° C. for 10 seconds, the metal layer does not substantially lower its peeling strength, but maintains a peeling strength of 1300 gf/cm which is more than satisfactory for any substrate for a TAB tape. Moreover, no peeling of the metal layer results from its dipping in a solution of cyanogen or a cyanogen compound. The improved heat and chemical resistance of the substrate, as well as the excellent electrical and mechanical properties which it inherently possesses, has made it possible to manufacture reliable products, such as PWB and FPC. A new problem has, however, been found to arise when the substrate prepared by the proposed method is used to make a TAB tape, as will hereinafter be pointed out.

The manufacture of a TAB tape using a copper-polyimide substrate including an electrolessly plated copper layer is usually carried out by a process which comprises applying a plating resist to the surface of the substrate, exposure and development, plating the exposed copper layer electrolytically with copper, removing the resist, applying a polyimide-resin etching resist to the whole surface of the substrate, exposure and development, and dissolving the polyimide resin in a solution containing hydrazine hydrate. When the substrate which has been heat treated in accordance with the proposed method is used to make a TAB tape, however, it has often been the case that the polyimide resin cannot be dissolved or removed satisfactorily, but that a discontinuous organic resin film having a thickness of, say, 0.01 to 10 microns remains on the surface of the substrate. The remaining film makes it difficult to plate the back surfaces of the copper leads with gold or silver completely and no proper bonding can eventually be achieved between the copper leads and IC chips.

As a result of the recent sophistication of technology relating to TAB, there is known a tape of a polyimide resin provided on both sides thereof with metal layers which are connected to each other through via holes to thereby form a signal layer and a ground layer, respectively, so that no noise may be produced during the transmission of high-frequency signals. The via holes are, however, formed by dissolving the polyimide resin. No complete connection between the metal layers is possible, if the resin is not satisfactorily dissolved to form the via holes, but leaves an organic film on the surface of any such metal layer.

Although it has been expected that the substrate prepared by the proposed method is useful for making a TAB tape, as well as a PWB or FPC, because of its excellent electrical, mechanical and thermal properties, the absence of any reliable technique for the removal of the polyimide resin still prevents the expected use of the substrate for making any satisfactory TAB tape.

SUMMARY OF THE INVENTION

Under these circumstances, it is an object of this invention to provide a novel process which ensures the effective removal by dissolution of a polyimide resin from any substrate prepared by the previously proposed method, without allowing for the formation of any undesirably remaining organic film, when it is used for making a TAB tape, and thereby enables the manufacture of a TAB tape of high quality.

This object is attained by a process for manufacturing a TAB tape from a copper-polyimide substrate prepared by forming an electrolessly plated copper layer on a polyimide resin and subjecting the substrate to heat treatment at a temperature of 120° C. to 420° C., characterized by comprising the first step of dissolving any unwanted portion of the polyimide resin in a solution containing hydrazine hydrate, whereby the copper layer is partially exposed, and the second step of subjecting the substrate to electrolysis using the exposed copper layer as a cathode and an insoluble electrode as an anode, whereby any organic matter remaining as a film after the first step is removed from the substrate by gas rising from the cathode.

The electrolysis as the second step is preferably carried out by using an electrolyte having a pH of 2 to 12 which is free of any substance deposited at the cathode, an electrolyte temperature of 25° C. to 70° C., and a current density of 5 to 10 A/dm$^2$ at the cathode. More preferably, the anode comprises a stainless steel plate and the electrolyte has a pH of 7 to 10 and is free of any metal ion.

The process of this invention enables the complete removal of the polyimide resin from those portions of the substrate in which through holes, etc. are to be formed, and thereby the manufacture of a TAB tape having excellent electrical, mechanical and thermal properties which will provide a highly reliable material for a wide range of electronic devices.

DETAILED DESCRIPTION OF THE INVENTION

While the modified layer which is formed on the resin surface by its etching prior to electroless plating as hereinbefore stated is converted by heat treatment to a group of thermally and chemically stable substances containing an imide bond which contribute to improving the adhesion of the metal layer, it has been found that a part of the modified layer does not undergo such conversion, but changes to a substance having a chemical structure which renders it sparingly soluble in the hydrazine hydrate solution used for dissolving the resin. This substance remains as a discontinuous organic film in the boundary between the resin and the metal layer, but we have found that it can be removed virtually completely by electrolysis.

The process of this invention essentially comprises etching any unwanted portion of the polyimide resin in a solution containing hydrazine hydrate to dissolve it partially, whereby the copper layer is partially exposed, and subjecting the substrate to electrolysis by using the exposed copper layer as the cathode and an insoluble electrode, such as a stainless steel plate, as the anode to remove any remaining organic film. The film remaining after etching is not a continuous one covering the whole surface of the copper layer, but the copper layer is partially exposed through the film. Therefore, gas rises from the exposed surface of the copper layer as a result of electrolysis and the physical action of the gas promotes the removal of the remaining film.

The dissolution of the resin as the first step of the process of this invention may be accomplished by any conventional method employing a solution containing hydrazine hydrate.

The electrolysis as the second step is carried out by using the copper layer as the cathode. If it is used as the anode, the partially exposed copper melts at the boundary between the copper and the resin, and the substrate has an uneven surface. A TAB tape made by using an uneven substrate will have leads which may fail to be properly bonded to IC chips, or PWB or FPC components.

The anode may comprises an electrically conductive material, such as a metal, which is usually employed as an electrode. Although there is no limitation to the material which can be employed, it is preferable to use an insoluble electrode material, such as a stainless steel plate. If a soluble material is used for the anode, the material which has dissolved is deposited on the exposed copper layer and causes it to lose or lower its surface smoothness and electrical conductivity, as well as lowering its bonding property. Most of the insoluble electrode materials including gold and platinum are, however, expensive. In this connection, we have selected as the preferred anode material a stainless steel plate which is available at a relatively low cost, and also which exhibits passivity in a neutral or alkaline electrolyte.

For the purpose of this invention, it is essential to use an electrolyte not containing any substance that may form a solid deposit on the cathode, and having a pH of 2 to 12. An electrolyte having a pH value lower than 2 causes the melting of the copper used as the cathode, and an electrolyte having a pH value higher than 12 corrodes the polyimide resin. The electrolyte preferably has a pH of, say, 7 to 10 if the anode comprises a stainless steel plate.

Although there is no particular limitation to the temperature at which the electrolyte is held during electrolysis, it is preferable to use a temperature of 25° C. to 70° C. to achieve a high electrolytic efficiency, while preventing any adverse effect on the polyimide resin. Although there is no particular limitation to the current density at the cathode, either, it is appropriate to employ a current density of, say, 5 to 10 A/dm$^2$ to prevent any excessive generation of gas that may result in the partial separation of the polyimide resin layer leading to the uneven surface of the substrate.

The invention will now be described more specifically with reference to several examples.

EXAMPLE 1

A polyimide resin film having a width of 35 mm, a length of 40 mm and a thickness of 50 microns was dipped in an aqueous solution containing 15 mols of hydrazine hydrate and 2 mols of potassium hydroxide per liter and having a temperature of 25° C. and was left to stand for 30 seconds, whereby its surface was etched. After it had been removed from the etching solution and washed with water, the film was dipped in a 5% by weight solution of hydrochloric acid having a temperature of 25° C. After 15 seconds, it was removed from the solution, and after it had been washed with water, it was caused to adsorb a catalyst manufactured by Okuno Pharmaceutical Co., Ltd. and known as OPC-80 Catalyst M. After this treatment had been continued for five minutes at 25° C., the film was washed with water carefully and was subjected to seven minutes of accelerating treatment at 25° C. by an accelerator manufactured by the same Japanese company and known as OPC-555. After it had been washed with water again, the surface of the film was left to stand at 20° C. for two minutes to dry. Then, electroless plating was conducted on the surface of the resin film under the conditions shown below by using a bath of the composition shown below:

| Bath Composition | |
|---|---|
| $CuSO_4.5H_2O$ | 10 g/liter |
| EDTA.2Na | 30 g/liter |
| 37% HCHO | 5 ml/liter |
| Dipyridyl | 20 mg/liter |
| PEG #1000 | 0.5 g/liter |

| Plating Conditions | |
|---|---|
| Temperature | 65° C. |
| Stirring | By air |
| Time | 10 min. |

The resulting substrate was heated for four hours in a heating furnace containing a nitrogen atmosphere held at a temperature of 350° C. Then, the electrolessly plated copper film was coated uniformly with a 40-micron thick layer of a photoresist produced by Tokyo Applied Chemical Industrial Co., Ltd. and designated as PMER N-HC 600 and the photoresist layer was baked at 70° C. for 15 minutes.

After a mask so designed as to form a TAB tape had been applied to the resist layer, ultraviolet radiation was applied to the resist layer in the amount of 1000 $mJ/cm_2$ by an exposer manufactured by Ushio Electric Corp. and designated as USH-500D, and the exposed resist layer was given five minutes of developing treatment at 25° C. in a resist developer produced by Tokyo Applied Chemical Industrial Co., Ltd. and designated as N-A5, whereby the electrolessly plated copper film was exposed through the resist layer. Then, electrolytic copper plating was conducted on the exposed film under the conditions shown below by using a bath having the composition shown below:

| Bath Composition | |
|---|---|
| $CuSO_4.5H_2O$ | 120 g/liter |
| $H_2SO_4$ | 150 g/liter |

| Plating Conditions | |
|---|---|
| Temperature | 25° C. |
| Cathode current density | 3 A/dm$^2$ |
| Stirring | By air and a cathode rocker |
| Time | 30 min. |

The substrate was left to stand at 60° C. for one min in a 4% by weight aqueous solution of sodium hydroxide, whereby the resist layer was removed from the electrolessly plated copper film to expose it. Then, the substrate was left to stand at 25° C. for one minute in a 20% by weight aqueous solution of cupric chloride, while the electrolytically plated copper film served as a mask, whereby the exposed portions of the electrolessly plated copper film were removed from the substrate. A photoresist consisting essentially of rubber was applied to the whole surface of the substrate, and was baked. After a mask so shaped as to form through holes for device connection had been applied to the photoresist, it was exposed to light and was, then, given a developing treatment. Then, the first step of the process of this invention was carried out under the conditions shown below by using a solution having the composition shown below:

| Composition of the Solution | |
|---|---|
| Hydrazine hydrate | 800 ml/liter |
| Ethylenediamine | 200 ml/liter |

| Conditions for Dissolution | |
|---|---|
| Temperature | 50° C. |
| Time | 5 min. |

After the first step had been finished, an organic film having a thickness of about 0.01 to about one micron was found to remain undissolved at the boundary between the metal layer and the polyimide resin. After the substrate had been washed with water, the second step of the process of this invention was carried out under the conditions shown below using a bath having the composition shown below to remove the remaining organic film electrolytically:

| Bath Composition | |
|---|---|
| Sodium tripolyphosphate | 10 g/liter |
| Sodium carbonate | 10 g/liter |
| Sodium hydroxide | 2 g/liter |
| Sodium lauryl sulfate | 10 mg/liter |

| Electrolytic Conditions | |
|---|---|
| Temperature | 50° C. |
| Anode | Stainless steel plate |
| Cathode current density | 5 A/dm$^2$ |
| Time | 1 min. |

As a result of the second step, the organic film was completely removed from the substrate. After the photoresist had been removed, the metal layer was plated with gold in a cyanogen solution, whereby a TAB tape was made. It was found to have excellent electrical, mechanical and thermal properties.

EXAMPLE 2

EXAMPLE 1 was repeated in every detail, except that the electrolytic removal of the organic film as the second step of the process was carried out under the conditions shown below by using an electrolyte having the composition shown below:

| Bath Composition | |
| --- | --- |
| Sulfuric acid | 50 g/liter |

| Electrolytic Conditions | |
| --- | --- |
| Temperature | 25° C. |
| Anode | Platinum plate |
| Cathode current density | 10 A/dm$^2$ |
| Time | 1 min. |

The resulting substrate was completely free of any undesirable organic film. The gold plating procedure of EXAMPLE 1 was, then, followed, and yielded a TAB tape having excellent electrical, mechanical and thermal properties.

COMPARATIVE EXAMPLE 1

EXAMPLE 1 was repeated, except that the electrolysis as the second step was carried out by using the copper layer on the substrate as the anode, and a platinum plate as the cathode. The melting of a part of the copper layer, however, deprived the substrate of its surface evenness.

The gold plating procedure of example 1 was followed to make a TAB tape, but the tape could not be put to any satisfactory use, as it allowed for only defective bonding.

COMPARATIVE EXAMPLE 2

EXAMPLE 1 was repeated, except that the electrolysis as the second step was carried out by using a copper plate as the anode. The deposition of the molten copper from the anode on the copper layer of the substrate deprived the substrate surface of its evenness. The gold plating procedure of EXAMPLE 1 was followed, but yielded only a TAB tape which could not withstand use because of defective bonding.

What is claimed is:

1. In a process for manufacturing a tape for tape automated bonding by using a copper-polyimide substrate prepared by forming an electrolessly plated copper layer on a polyimide resin, and heat treated at a temperature of 120° C. to 420° C., the improvement which comprises:
    dissolving any unwanted portion of said resin in a solution containing hydrazine hydrate, whereby said copper layer is partially exposed; and
    conducting electrolysis by using said exposed copper layer as a cathode and an insoluble anode to cause gas to rise from said cathode to thereby remove any undesirably remaining polyimide resin from said substrate.

2. A process as set forth in claim 1, wherein said electrolysis is carried out by using an electrolyte having a pH of 2 to 12 and free of any substance that will form a deposit on said cathode during said electrolysis.

3. A process as set forth in claim 1, wherein said anode comprises a stainless steel plate, and said electrolysis is carried out by using an electrolyte having a pH of 7 to 10 and free of any metal ion.

4. A process as set forth in any of claims 1 to 3, wherein said dissolving is achieved by etching.

5. A process as set forth in claim 2 or 3, wherein said electrolyte has a temperature of 25° C. to 70° C., and said cathode has a current density of 5 to 10 A/dm$^2$.

* * * * *